United States Patent
Yanazawa et al.

(10) Patent No.: US 10,290,395 B2
(45) Date of Patent: May 14, 2019

(54) CONDUCTIVE PATH PROTECTION STRUCTURE

(71) Applicants: YAZAKI CORPORATION, Tokyo (JP); TOYOTA JIDOSHA KABUSHIKI KAISHA, Toyota-shi (JP)

(72) Inventors: Kenta Yanazawa, Makinohara (JP); Tatsuyoshi Ueta, Makinohara (JP); Takuma Miyazaki, Makinohara (JP); Yoshiyuki Ishihara, Toyota (JP)

(73) Assignees: YAZAKI CORPORATION, Minato-ku, Tokyo (JP); TOYOTA JIDOSHA KABUSHIKI KAISHA, Aichi-ken (JP)

( * ) Notice: Subject to any disclaimer, the term of this patent is extended or adjusted under 35 U.S.C. 154(b) by 0 days.

(21) Appl. No.: 15/596,641

(22) Filed: May 16, 2017

(65) Prior Publication Data

US 2017/0338004 A1    Nov. 23, 2017

(30) Foreign Application Priority Data

May 17, 2016    (JP) .................. 2016-098632

(51) Int. Cl.
*H05K 9/00* (2006.01)
*H01B 7/18* (2006.01)
(Continued)

(52) U.S. Cl.
CPC .............. *H01B 7/185* (2013.01); *H01B 7/36* (2013.01); *H01B 7/365* (2013.01); *H02G 3/0418* (2013.01); *H05K 9/0098* (2013.01)

(58) Field of Classification Search
CPC ...... H05K 9/0098; H01B 7/365; H01B 7/368; H01B 7/1845; H02G 3/0418
See application file for complete search history.

(56) References Cited

U.S. PATENT DOCUMENTS

| | | | | |
|---|---|---|---|---|
| 5,796,905 A | * | 8/1998 | Hoffart | G02B 6/4482 385/102 |
| 6,825,418 B1 | * | 11/2004 | Dollins | H01B 7/361 174/112 |

(Continued)

FOREIGN PATENT DOCUMENTS

| | | |
|---|---|---|
| CN | 103688432 A | 3/2014 |
| JP | 57-146720 U1 | 3/1981 |

(Continued)

OTHER PUBLICATIONS

Chinese Office Action issued in the Chinese Application No. 201710347137.8; dated Jun. 5, 2018.

(Continued)

*Primary Examiner* — Hung V Ngo
(74) *Attorney, Agent, or Firm* — Sughrue Mion, PLLC

(57) ABSTRACT

A conductive path protection structure includes a first protector configured to accommodate a conductive path therein and to protect the conductive path, and a second protector configured to accommodate the first protector therein. An identification mark for identifying a specification of the conductive path is provided on a peripheral surface of the first protector. The second protector is formed with an opening configured to expose the identification mark therethrough to an outside of the second protector.

9 Claims, 7 Drawing Sheets

(51) Int. Cl.
*H01B 7/36* (2006.01)
*H02G 3/04* (2006.01)

(56) References Cited

U.S. PATENT DOCUMENTS

| | | | |
|---|---|---|---|
| 9,233,654 B2 | 1/2016 | Nagayasu et al. | |
| 2004/0098889 A1* | 5/2004 | Proctor | G09F 3/00 40/316 |
| 2008/0271919 A1* | 11/2008 | Elko | H02G 3/0481 174/70 C |
| 2009/0001707 A1* | 1/2009 | Brooks | B65C 3/02 283/81 |
| 2009/0188694 A1* | 7/2009 | Pereira | H02G 3/0468 174/112 |
| 2009/0211781 A1* | 8/2009 | Suzuki | B60R 16/0215 174/101 |
| 2010/0101821 A1* | 4/2010 | Agan | H01B 7/368 174/109 |
| 2011/0011639 A1* | 1/2011 | Visser | H01B 11/1008 174/350 |
| 2012/0152588 A1* | 6/2012 | Asztalos | H02G 3/0418 174/68.3 |
| 2013/0032393 A1 | 2/2013 | Toyama | |
| 2014/0165392 A1 | 6/2014 | Toyama et al. | |
| 2015/0170796 A1 | 6/2015 | Inao et al. | |
| 2015/0179308 A1 | 6/2015 | Inao et al. | |
| 2016/0152196 A1 | 6/2016 | Inao et al. | |

FOREIGN PATENT DOCUMENTS

| | | |
|---|---|---|
| JP | 2011-165356 A | 8/2011 |
| JP | 2012-90505 A | 5/2012 |
| JP | 2012-217286 A | 11/2012 |
| JP | 2014-50267 A | 3/2014 |
| JP | 2014-54137 A | 3/2014 |
| JP | 2014-147272 A | 8/2014 |
| WO | 2015/005402 A1 | 1/2015 |

OTHER PUBLICATIONS

Communication dated Jun. 5, 2018, issued by the Japanese Patent Office in counterpart Japanese Application No. 2016-098632.
Communication dated Jan. 8, 2019, issued by the Japanese Patent Office in counterpart Japanese Patent Application No. 2016-098632.
Office Action dated Feb. 19, 2019 by the State Intellectual Property Office of P.R. China in counterpart Chinese Patent Application No. 201710347137.8.

* cited by examiner

CONDUCTIVE PATH PROTECTION STRUCTURE

CROSS REFERENCE TO RELATED APPLICATIONS

This application is based on Japanese Patent Application (No. 2016/098632) filed on May 17, 2016, the contents of which are incorporated herein by reference.

BACKGROUND

The present invention relates to a conductive path protection structure which includes a first protector for protecting a conductive path and a second protector separate from the first protector for protecting a conductive path.

In the related art, when a wire harness used for electrical wiring of a vehicle or the like is disposed, for example, under the floor of a vehicle, or the like, since a conductive path such as an electric wire is likely to be damaged by jumping of a small stone or the like, the conductive path is protected by an exterior member called a protector and thus damage of the conductive path is prevented.

This protector is used, for example, as a protector which protects most of the conductive path by a tubular member having a simple shape such as a corrugated tube, and in a case where rigidity should be increased partially, a protector which is a separated member from the tubular protector is used.

For example, Patent Document 1 discloses a protector for the wire harness which includes a visual hole capable of confirming an end position of a corrugated tube inserted in a protector.

In addition, in recent years, due to the widespread use of a hybrid vehicle or the like, a high-voltage electric wire is widely used for the wire harness.

Therefore, in order to distinguish the high-voltage electric wire from the low-voltage electric wire in consideration of the safety aspect, it is possible to distinguish by unifying the color of an insulating coating material covering an peripheral surface of the electric wire to orange.

Such a method of identifying the specifications of electric wires such as high pressure, low pressure, or the like also tends to be applied to protectors attached to electric wires. Therefore, both the first protector and the second protector described above are getting colored orange in a case of being used as protectors for the high-voltage electric wires.

[Patent Document 1] JP-A-2012-217286

SUMMARY OF INVENTION

An object of the invention is to provide a conductive path protection structure which can decrease costs by incorporating a protector that can easily identify a specification of a conductive path without applying identification mark according to the specifications of the conductive path and can reliably prevent the conductive path from being damaged.

According to one aspect of the invention, there is provided a conductive path protection structure including:

a first protector configured to accommodate a conductive path therein and to protect the conductive path; and a second protector configured to accommodate the first protector therein, wherein an identification mark for identifying a specification of the conductive path is provided on a peripheral surface of the first protector, and the second protector is formed with an opening configured to expose the identification mark therethrough to an outside of the second protector.

The second protector may be formed with a plurality of openings at least one of which configured to expose the identification mark therethrough to the outside of the second protector, and the openings may be disposed at positions along an insertion path through which the first protector is inserted in the second protector.

The conductive path protection structure may further include the conductive path, the conductive path may be covered by an electromagnetic shield member, and an peripheral surface of the electromagnetic shield member may be exposed to an inner surface of the first protector.

The conductive path may be inserted into an inside of the first protector over entire insertion path in the second protector.

A rigidity of the second protector may be higher than a rigidity of the first protector

BRIEF DESCRIPTION OF DRAWINGS

FIG. 1A is a view illustrating a state two first protectors into which electric wires having the same specifications are inserted respectively insert into a second protector, and FIG. 1B is a view illustrating a state two first protectors into which electric wires having the different specifications from each other are inserted respectively insert into the second protector.

FIG. 4 is a perspective view illustrating the first protector, an electric wire inserted through the inside portion of the first protector, or the like.

DETAILED DESCRIPTION OF EXEMPLIFIED EMBODIMENTS

In a case where the second protector is colored corresponding to the identification of the high-voltage electric wire, it is necessary to use only protectors different in color only between gasoline vehicles using low-voltage electric wires and hybrid cars heavily using high-voltage electric wires.

Figure 7A:
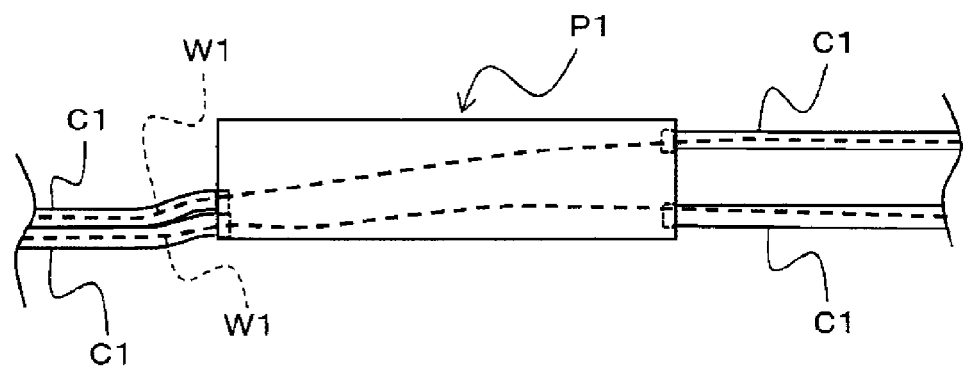
FIGS. 7A and 7B are views for explaining the related art.
Figure 7B:
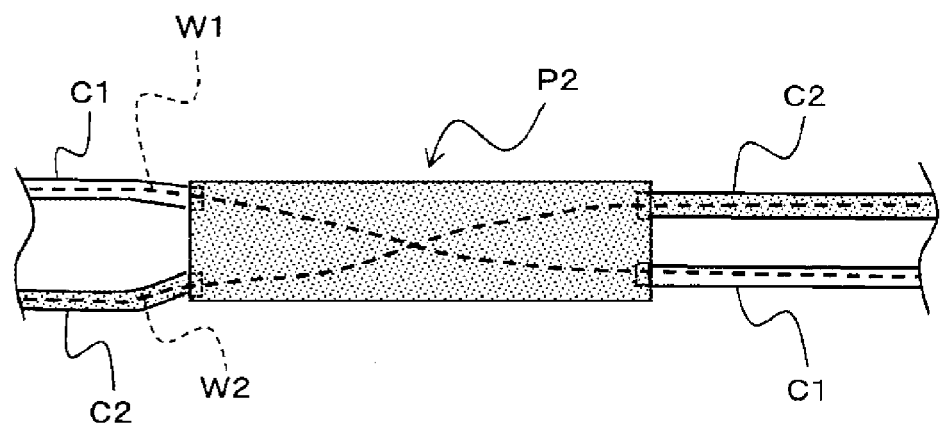

More specifically, as illustrated in FIGS. 7A and 7B, in a case where the corrugated tube C1 (first protector) is identified by a color frequently used to the corrugated tube (hereinafter, referred to as natural color) in order to indicate that the corrugated tube C1 protects the low-voltage electric wire W1, the second protector P1 (see FIG. 7A) for inserting and protecting only the low-voltage electric wire W1 uses a protector colored in the natural color.

On the other hand, in a case where a corrugated tube C2 (first protector) is identified by an orange color in order to indicate that the corrugated tube C2 protects the high-voltage electric wire W2, a second protector P2 (see FIG. 7B) for inserting and protecting an electric wire including the high-voltage electric wire W2 uses a protector colored in the orange color.

Therefore, it is necessary to prepare two component numbers indicated by reference numerals P1 and P2 for the second protector which is different only in color and this causes increase in cost.

In such a case, as described in Patent Document 1, by providing the visual hole in the protector and confirming the color of an end portion of the corrugated tube through the visual hole, it is possible to identify the specification of the conductive path such as electric wire without applying a process for identification such as color coding to the protector.

However, in the protector for wire harness described in Patent Document 1, since the visual hole of the protector is positioned at the position of the end portion of the corrugated tube, both the protector and the corrugated tube are unlikely to protect the electric wire from the outside portion at the visual hole position, the electric wire becomes directly susceptible to the influence of water or foreign material which is penetrated from the outside, as a result, the electric wire may be damaged, and moreover, since only the vicinity of the end portion of the corrugated tube can be visually recognized through the visual hole, it is difficult to visually recognize the specification of the electric wire and it is not realistic.

The invention has been made in view of the above problems, and an object of the invention is to provide a conductive path protection structure which can decrease costs by incorporating a protector that can easily identify a specification of a conductive path without applying identification mark according to the specifications of the conductive path and can reliably prevent the conductive path from being damaged.

Hereinafter, with reference to drawings, preferred example of a conductive path protection structure according to the invention will be described in detail.

Figure 1A:
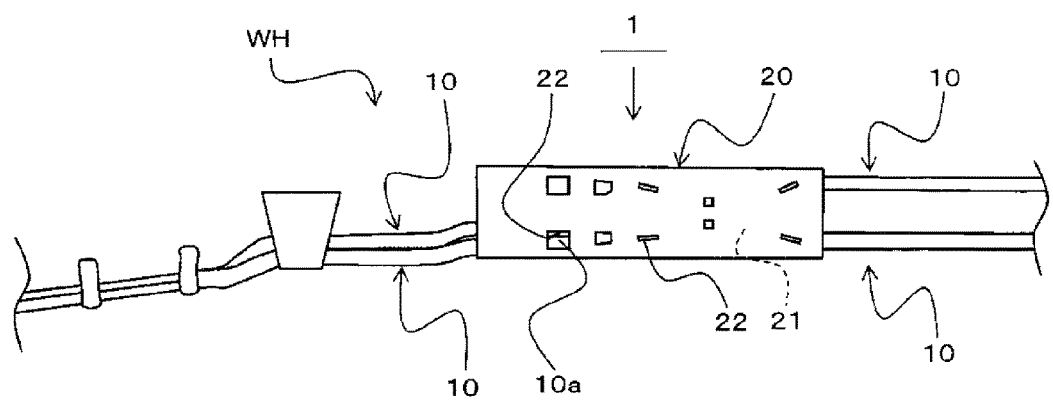
FIG. 1A and FIG. 1B are views of a wire harness including a conductive path protection structure according to an example of the invention.
Figure 1B:
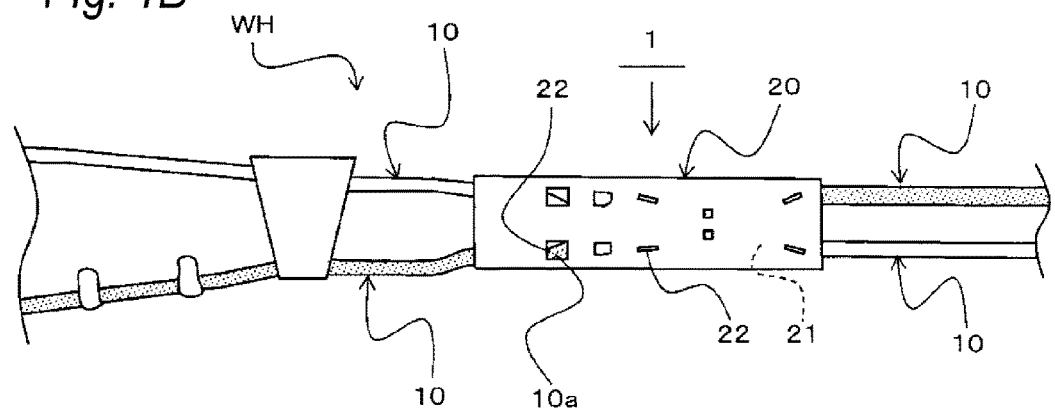
Figure 2A:
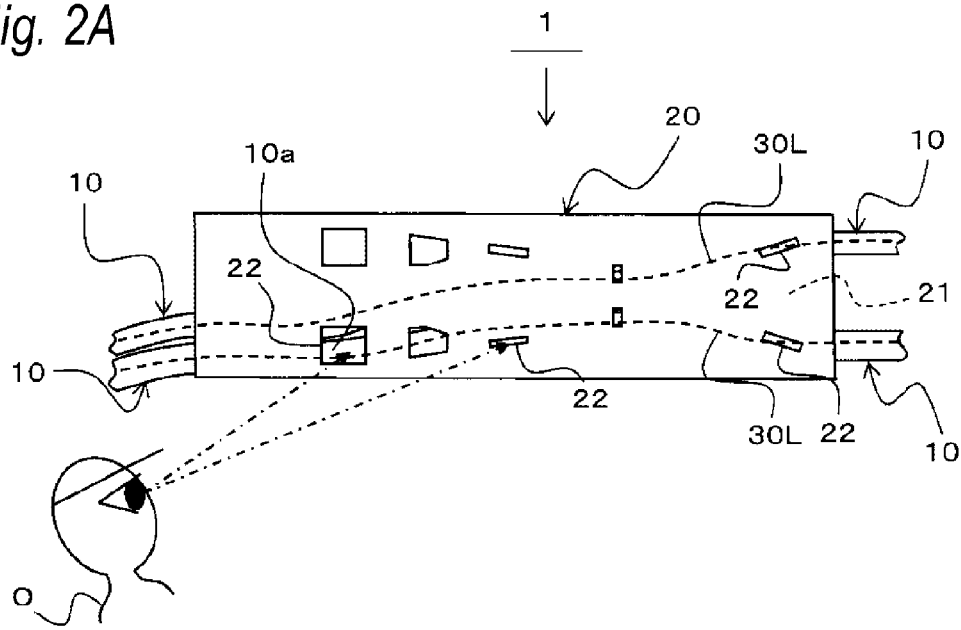
FIGS. 2A and 2B are enlarged views illustrating periphery of the second protector of the wire harness illustrated in FIGS. 1A and 1B.
Figure 2B:
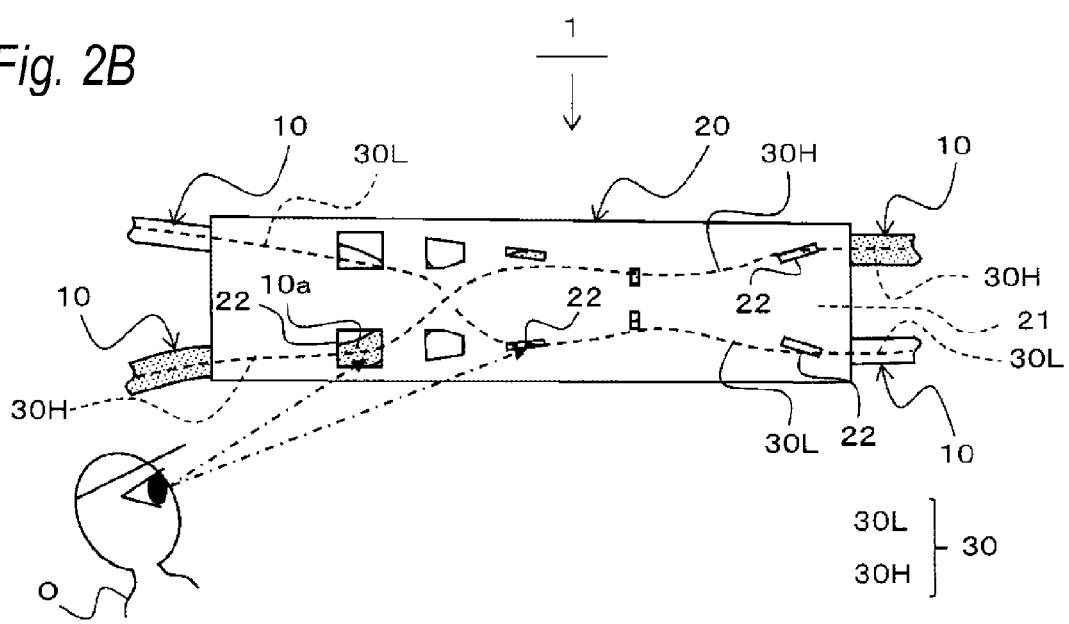
Figure 3A:
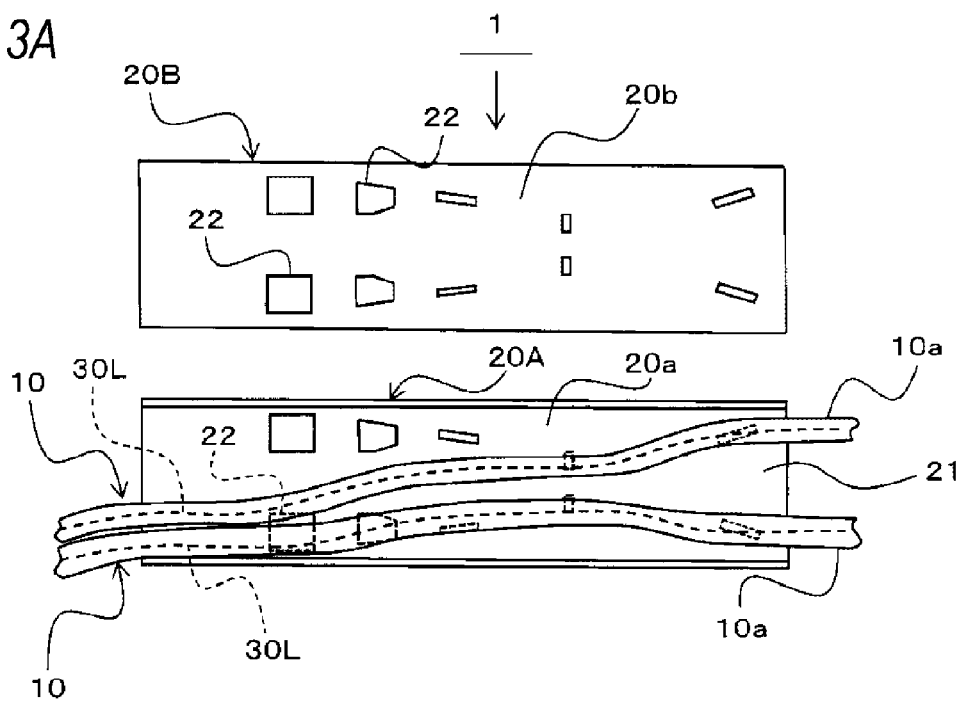
FIGS. 3A and 3B are views illustrating a state in which a lid is removed from a main body of the second protector illustrated in FIGS. 2A and 2B.
Figure 3B:
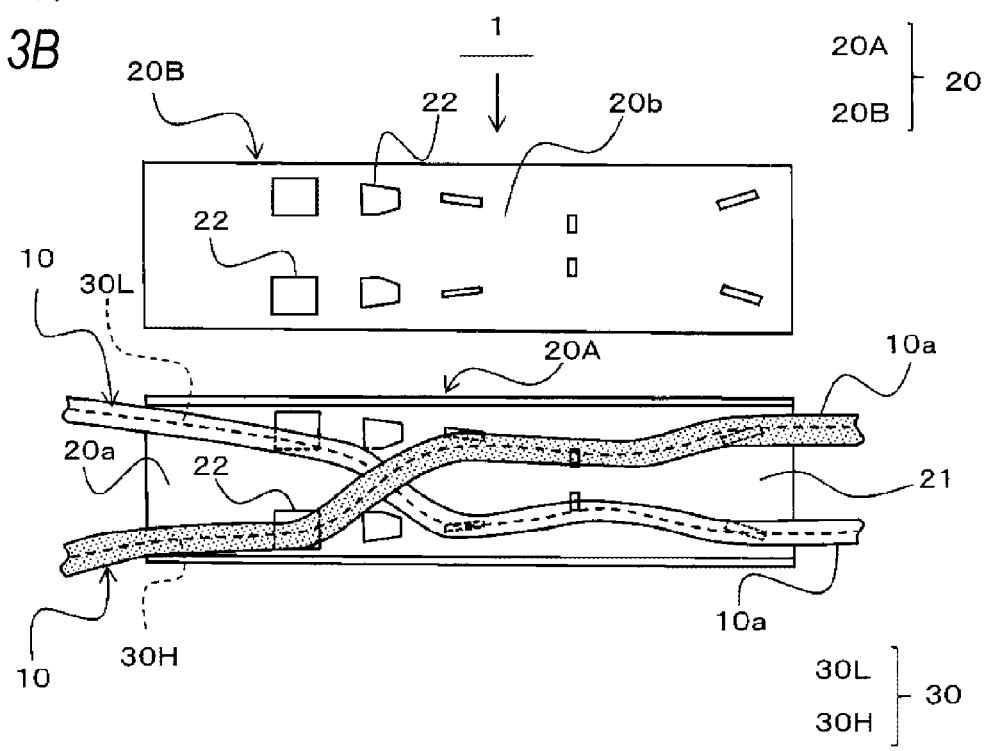
Figure 4:
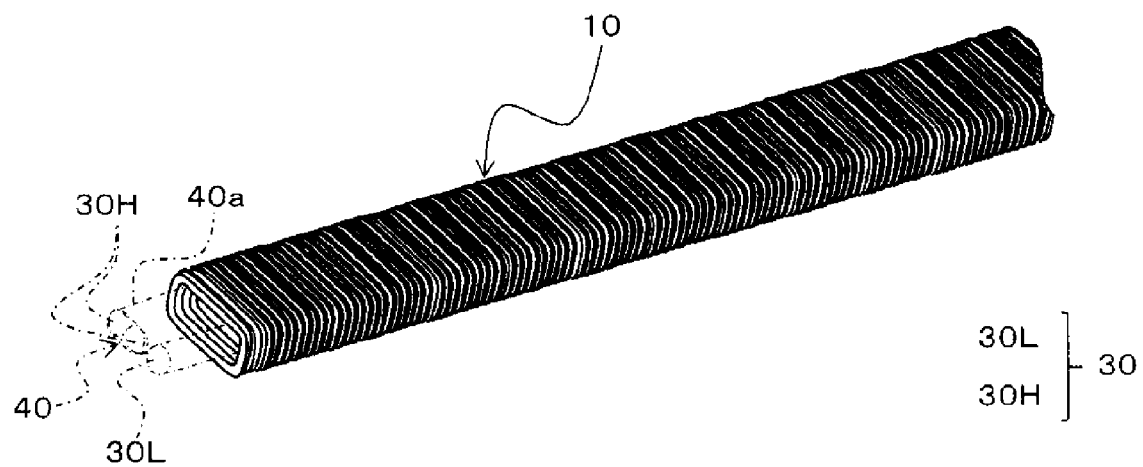
Figure 5:
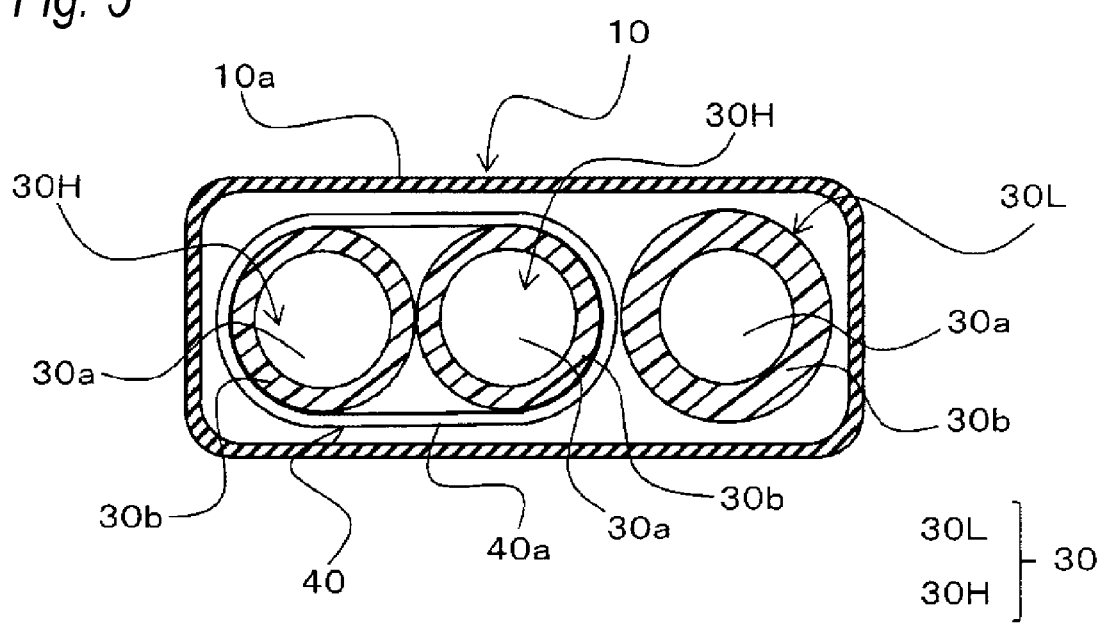
FIG. 5 is a cross-sectional view illustrating the first protector in which an electric wire or the like is inserted into the inside portion thereof as illustrated in FIG. 4.

FIG. 1A and FIG. 1B are views of a wire harness WH including a conductive path protection structure 1 according to an example of the invention, FIG. 1A is a view illustrating a state two first protectors 10 into which electric wires having the same specifications are inserted respectively insert into a second protector 20, and FIG. 1B is a view illustrating a state two first protectors 10 into which electric wires 30H and 30L having the different specifications from each other are inserted respectively insert into the second protector 20. FIGS. 2A and 2B are enlarged views illustrating periphery of the second protector 20 of the wire harness WH illustrated in FIGS. 1A and 1B. FIGS. 3A and 3B are views illustrating a state in which a lid 20B is removed from a main body 20A of the second protector 20 illustrated in FIGS. 2A and 2B. FIG. 4 is a perspective view illustrating the first protector 10, an electric wire 30 inserted through the inside portion of the first protector 10, or the like. FIG. 5 is a cross-sectional view illustrating the first protector 10 in which an electric wire 30 or the like is inserted into the inside portion thereof as illustrated in FIG. 4.

In FIG. 4, the electric wire 30 or the like inserted through the inside portion of the first protector 10 is indicated by one-dot chain lines.

Figure 6:
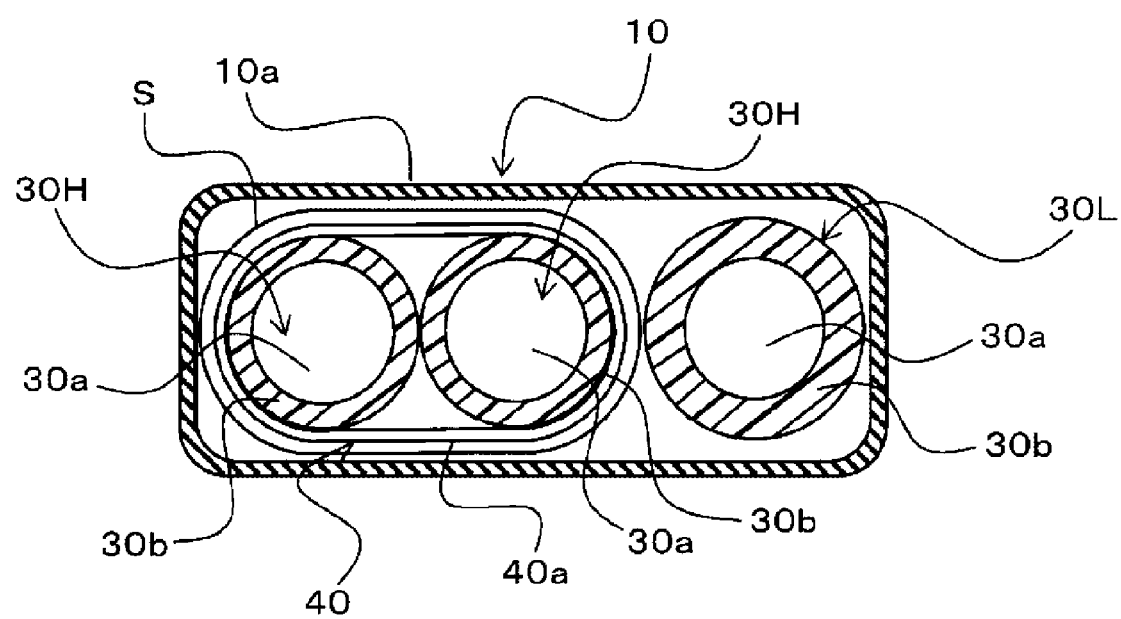
FIG. 6 is a view for explaining a configuration of the inside portion of the first protector in a case where an peripheral surface of a braid in illustrated in FIG. 5 is covered with an insulating coating.

FIG. 6 is a sectional view for explaining a configuration of the inside portion of the first protector 10 in a case where an peripheral surface 40a of a braid 40 in illustrated in FIG. 5 is covered with an insulating coating S.

The conductive path protection structure 1 according to the example of the present invention is incorporated in the wire harness WH used, for example, for electrical wiring of a vehicle or the like.

The conductive path protection structure 1 is applied to a case where it is necessary to identify the specification of the electric wire 30 as a conductive path used for the wire harness WH.

The conductive path protection structure 1 includes a first protector 10 and a second protector 20 which is a separated member from the first protector 10. The first protector 10 protects the electric wire 30 by the electric wire 30 as a conductive path being inserted into an inside portion thereof. The second protector 20 protects the electric wire 30 by the electric wire 30 being inserted into an inside portion thereof. The first protector 10 accommodates the electric wire 30 therein and protects the electric wire 30, and the second protector 20 accommodates the first protector 10 therein.

The first protector 10 is a tubular member made of an insulating synthetic resin material. In this example, as the first protector 10, a corrugated tube which is a flexible member is used, and as illustrated in FIG. 4, is formed in a bellows shape including a recessed portion and a projection portion which are alternately and continuously formed along the axial direction.

An identification mark for identifying the specification of the electric wire 30 to be protected is provided on a peripheral surface of the first protector 10.

More specifically, in a case where the high-voltage electric wire is included in the electric wire 30 to be protected, the first protector 10 uses a protector which has an orange color.

In a case where the high-voltage electric wire is not included in the electric wire 30 to be protected, the first protector 10 uses a protector which has a natural color such as a gray color.

In the example, as illustrated in FIG. 4 and FIG. 5, two high-voltage electric wires 30H and one low-voltage electric wire 30L are inserted through the first protector 10, and the first protector 10 protects the electric wires 30H and 30L inserted into the inside portion thereof.

Each of the electric wires 30 includes a conductor portion 30a made of a plurality of conductive strands or a single core wire and an insulating coating portion 30b made of an insulating synthetic resin covering an outer peripheral surface of the conductor portion 30a in an insulating manner.

The two high-voltage electric wires 30H protected by the first protector 10 are covered by the braid 40 functioning as an electromagnetic shield member.

In the first protector 10, the braid 40 is disposed in the inside portion thereof in a state where a peripheral surface 40a thereof is exposed. More specifically, the peripheral surface 40a of the braid 40 is exposed to an inner surface of the first protector 10.

In other words, the peripheral surface 40a of the braid 40 is not protected by an insulating coating or the like, but is exposed to an inside portion of the first protector 10.

The reason why the peripheral surface 40a of the braid 40 can be kept exposed without being protected by the insulating coating or the like as described above is that the braid 40 is not to be exposed to the outside portion by being constantly protected by the first protector 10 even in the second protector 20.

In the example, although the braid 40 is used as the electromagnetic shield member as an example, the invention is not limited thereto. As the electromagnetic shield member 40, other members such as a metal foil, or the like as long as functioning as an electromagnetic shield may be used.

In addition, in the example, although the peripheral surface 40a of the braid 40 is exposed without being protected by an insulating coating or the like as an example, the invention is not limited thereto. As illustrated in FIG. 6, the peripheral surface 40a of the braid 40 may be protected by an insulating coating or the like.

In addition, the configuration of the electric wire 30 inserted into the inside portion of the first protector 10 is not limited to that illustrated in the example, and other configurations may be adopted. For example, the number of electric wires 30 inserted into the inside portion of the first protector 10 may be other than three.

The second protector 20 is in a state in which the electric wire 30 is inserted into the inside portion of the first protector 10 over the entire insertion path in the second protector 20. The second protector 20 is formed with an opening 22 through which a portion of the peripheral surfaces 10a of the first protector 10 inserted into the inside portion thereof can be visually observed. In other words, the second protector 20 is formed with the opening 22 through which the identification mark is exposed to an outside of the second protector 20.

More specifically, as illustrated in FIG. 3, the second protector 20 has a main body 20A made of an insulating synthetic resin material and a lid 20B, and has a rigidity which is greater than that of the first protector 10.

In the second protector 20, an internal space 21 formed by being surrounded by the main body 20A and the lid 20B passes through from one end side of the second protector 20 to the other end side thereof.

The first protector 10 is adapted to be inserted from one end side to the other end side of the second protector 20 through the internal space 21.

The openings 22 are formed at a plurality of positions in the second protector 20 along the insertion path of the electric wire 30.

In the example, the openings 22 of the same shape are formed on the opposing walls 20a and 20b corresponding to the main body 20A and the lid 20B, respectively.

In addition, the opening 22 not only functions to identify the specification of the electric wire 30 but also functions as a drain hole of water which is penetrated into the second protector 20.

Further, the openings 22 are formed at a plurality of positions of the second protector 20, thereby contributing to decrease in the weight of the second protector 20.

The second protector 20 is configured such that the first protector 10 is inserted over a predetermined insertion path in the second protector 20 by a guide groove, a guide projection, or the like (not illustrated) provided on the inside portion of the second protector 20.

As illustrated in FIGS. 2A and 2B, in the conductive path protection structure 1, an operator 0 visually observes the first protector 10 in the inside portion of the second protector 20 from the outside thereof through the opening 22, and confirms the color of the peripheral surface 10a of the first protector 10, and thus it is possible to confirm whether or not the high-voltage electric wire 30H is inserted into the second protector 20.

In other words, in the conductive path protection structure 1, even if the second protector 20 does not make the coloring or the like different for identifying the specification of the electric wire 30, the specification of the electric wire 30 inserted into the second protector 20 can be identified by confirming the identification mark for identifying the specification of the electric wire 30 provided on the peripheral surface 10a of the first protector 10 through the openings 22.

In the conductive path protection structure 1 according to the example of the invention, since the first protector 10 is provided with an identification mark for identifying the specification of the electric wire 30 as a conductive path to be protected on the peripheral surface 10a thereof, the second protector 20 is in a state where the electric wire 30 is inserted into the inside portion of the first protector 10 over the entire insertion path in the second protector 20 and is formed with the openings 22 through which a portion of the peripheral surface 10a of the first protector 10 inserted into the inside portion thereof can be visually observed, and the color as the identification mark provided on the peripheral surface 10a of the first protector 10 from the opening 22 can be confirmed, there is no need to provide the identification mark for identifying the specification of the electric wire 30 inserted into the inside portion thereof on the second protector 20 itself, and moreover, since the electric wire 30 in the portion exposed through the opening 22 is protected by the first protector 10, increase in the cost is suppressed by incorporating a protector which can easily identify the specification of the electric wire 30 even without providing identification mark corresponding to the specification of the electric wire 30 as a conductive path and moreover, the damage to the electric wire 30 can be reliably prevented.

In addition, in the conductive path protection structure 1 according to the example of the invention, since the opening 22 is formed at a plurality of positions along the insertion path of the first protector 10 in the second protector 20, the color as an identification mark of the electric wire 30 provided on the peripheral surface of the first protector 10 can be confirmed through the plurality of openings 22 and moreover, the water which is penetrated into the second protector 20 can be discharged from the plurality of openings 22, and furthermore, the weight of the second protector 20 can be decreased.

In addition, in the conductive path protection structure 1 according to the example of the present invention, by the braid 40 as the electromagnetic shield member 40 being constantly protected by the first protector 10 even in the second protector 20, since the braid 40 is also not to be exposed to the outside portion through the opening 22 provided on the second protector 20, even in a state where the peripheral surface of the braid 40 is exposed at the inside portion of the first protector 10, damage of the braid 40 can be prevented, and as a result, since the insulating coating for protecting the peripheral surface of the braid 40 can be omitted, the configuration of the shielded electric wire using the electromagnetic shield member can be simplified.

In the conductive path protection structure 1 according to the example of the invention, although the corrugated tube is used as the first protector 10 as an example, the invention is not limited thereto. Other members may be used as long as being a tubular member which can protect the electric wire 30 inserted in the inside portion thereof. For example, a tubular protector in which a bellows portion and a straight tubular portion are mixed along the extending direction may be used.

In addition, in the conductive path protection structure 1 according to the example of the invention, although the conductive path is the electric wire 30 as an example, the invention is not limited thereto. The conductive path 30 may use other members as long as being a conductive member for forming an electric circuit such as a bus bar.

In addition, in the conductive path protection structure 1 according to the example of the invention, although the specification of the electric wire 30 is identified by the color of the peripheral surface 10a of the first protector 10 as an example, it may be identified by other configurations. For example, it may be identified by a pattern provided on the peripheral surface 10a of the first protector 10 or a three-dimensional shape. More specifically, the specification of the electric wire 30 can be identified by the projection portion which is visually observed from the opening 22 by as an identification by, as the three-dimensional shape, a projection portion (three-dimensional shape) for identifying the specification of the electric wire 30 being provided on the peripheral surface 10a of the first protector 10 and the opening 22 being provided at a position which can be confirmed by the projection portion.

Here, features of the above-described exemplary embodiment of the conductive path protection structure according to the present invention are respectively briefly summarized in below-described (i) to (v).

(i) A conductive path protection structure (1) including:
a first protector (10) configured to accommodate a conductive path (30) therein and to protect the conductive path (30); and
a second protector (20) configured to accommodate the first protector (10) therein,
wherein an identification mark for identifying a specification of the conductive path (30) is provided on a peripheral surface (10a) of the first protector (10), and
the second protector (20) is formed with an opening (22) configured to expose the identification mark therethrough to an outside of the second protector (20).

(ii) The conductive path protection structure (1) as set forth in the (i) above, wherein the second protector (20) is formed with a plurality of openings (22) at least one of which configured to expose the identification mark therethrough to the outside of the second protector (20), and the openings (22) are disposed at positions along an insertion path through which the first protector (10) is inserted in the second protector (20).

(iii) The conductive path protection structure (1) as set forth in the (i) or (ii) above further including the conductive path (30), wherein the conductive path (30) is covered by an electromagnetic shield member (40), and an peripheral surface (40a) of the electromagnetic shield member (40) is exposed to an inner surface of the first protector (10).

(iv) The conductive path protection structure (1) as set forth in the (i) above, wherein the conductive path (30) is inserted into an inside of the first protector (10) over entire insertion path in the second protector (20).

(v) The conductive path protection structure (1) as set forth in the (i) above, wherein a rigidity of the second protector (20) is higher than a rigidity of the first protector (10).

In the conductive path protection structure according to the invention, since the first protector is provided with the identification mark for identifying the specification of the conductive path to be protected on the peripheral surface thereof, the second protector is in a state where the conductive path is inserted into the inside portion of the first protector over the entire insertion path in the second protector, and is formed with openings through which a portion of the peripheral surface of the first protector inserted into the inside portion thereof can be visually observed, and the identification mark which is provided on the peripheral surface of the first protector can be confirmed through the openings, there is no need to provide identification mark for identifying the specification of the conductive path which is inserted into the inside portion of the second protector on the second protector itself and moreover, since the conductive path is protected by the first protector in a portion of the conductive path exposed through the opening, increase in cost can be suppressed by incorporating a protector which can easily identify the specification of the conductive path even if the identification mark according to the specification of the conductive path is not applied and moreover, the damage of the conductive path can be reliably prevented.

In the conductive path protection structure according to of the invention, since the openings are formed at a plurality of positions along the insertion path of the first protector in the second protector, the identification mark of the conductive path provided on the peripheral surface of the first protector can be confirmed from the plurality of openings, moreover, the water which is penetrated into the second protector can be discharged from the plurality of openings, and furthermore, the weight of the second protector can be decreased.

In the conductive path protection structure according to the invention, by the electromagnetic shield member being constantly protected by the first protector even in the second protector, since the electromagnetic shield member is not also exposed to the outside portion through the opening provided on the second protector, even in a state where the peripheral surface of the electromagnetic shield member is exposed in the inside portion of the first protector, damage of the electromagnetic shield member can be prevented, and as a result, since the insulating coating for protecting the peripheral surface of the electromagnetic shield member can be omitted, the configuration of the shielded electric wire using the electromagnetic shield member can be simplified.

As described above, although the invention made by the present inventor has been specifically described based on the example of the invention described above, the invention is not limited to the example of the invention described above, and various modifications are possible in the scope which does not deviate from the gist of the invention.

What is claimed is:

1. A conductive path protection structure comprising:
   a first protector configured to accommodate a conductive path therein and to protect the conductive path; and
   a second protector configured to accommodate the first protector therein, the second protector comprising a main body and a lid,
   wherein an identification mark for identifying a specification of the conductive path is provided on a peripheral surface of the first protector,
   the second protector is formed with a first opening and a second opening configured to expose the identification mark therethrough to an outside of the second protector, and
   the first opening and the second opening are formed on the main body and the lid, respectively, so that the first opening and the second opening are facing each other when the lid is attached to the main body.

2. The conductive path protection structure as set forth in claim 1, wherein
   the second protector is formed with a plurality of openings at least one of which configured to expose the identification mark therethrough to the outside of the second protector, and
   the openings are disposed at positions along an insertion path through which the first protector is inserted in the second protector.

3. The conductive path protection structure as set forth in claim 1, further comprising the conductive path, the conductive path is covered by an electromagnetic shield member,
wherein a peripheral surface of the electromagnetic shield member is exposed to an inner surface of the first protector.

4. The conductive path protection structure as set forth in claim 2, further comprising the conductive path,
the conductive path is covered by an electromagnetic shield member,
wherein a peripheral surface of the electromagnetic shield member is exposed to an inner surface of the first protector.

5. The conductive path protection structure as set forth in claim 1, wherein
the conductive path is inserted into an inside of the first protector over an entire insertion path of the conductive path in the second protector.

6. The conductive path protection structure as set forth in claim 1, wherein
a rigidity of the second protector is higher than a rigidity of the first protector.

7. The conductive path protection structure as set forth in claim 1, wherein
the first opening and the second opening that are configured to expose the identification mark therethrough to the outside of the second protector are formed at a middle section of the second protector in a direction in which the conductive path extends through the first protector.

8. The conductive path protection structure as set forth in claim 1, further comprising:
a third protector configured to accommodate a second conductive path therein and to protect the second conductive path, wherein
the second protector is further configured to accommodate the third protector therein,
a second identification mark for identifying a specification of the second conductive path is provided on a peripheral surface of the third protector, and
the second protector is formed with a third opening configured to expose the second identification mark therethrough to the outside of the second protector.

9. The conductive path protection structure as set forth in claim 1, wherein
the second protector is configured to accommodate the first protector therein without the first protector penetrating through the first opening and the second opening.

* * * * *